US007915909B2

(12) United States Patent
Dunn et al.

(10) Patent No.: US 7,915,909 B2
(45) Date of Patent: Mar. 29, 2011

(54) RF INTEGRATED CIRCUIT TEST METHODOLOGY AND SYSTEM

(75) Inventors: Clifford J. Dunn, San Jose, CA (US); George Palmer, San Jose, CA (US); Jeffrey M. Gilbert, Palo Alto, CA (US)

(73) Assignee: Sibeam, Inc., Sunnyvale, CA (US)

( * ) Notice: Subject to any disclaimer, the term of this patent is extended or adjusted under 35 U.S.C. 154(b) by 74 days.

(21) Appl. No.: 12/059,757

(22) Filed: Mar. 31, 2008

(65) Prior Publication Data

US 2009/0153158 A1 Jun. 18, 2009

Related U.S. Application Data

(60) Provisional application No. 61/014,656, filed on Dec. 18, 2007.

(51) Int. Cl.
*G01R 31/00* (2006.01)
(52) U.S. Cl. ............................. 324/762.01; 324/762.02
(58) Field of Classification Search .................... None
See application file for complete search history.

(56) References Cited

U.S. PATENT DOCUMENTS

| 5,647,756 | A | 7/1997 | Twigg et al. |
| 5,781,018 | A * | 7/1998 | Davidov et al. ............... 324/637 |
| 6,201,403 | B1 | 3/2001 | Rollin et al. |
| 6,236,223 | B1 * | 5/2001 | Brady et al. .................. 324/765 |
| 6,791,317 | B1 | 9/2004 | Walsh et al. |
| 7,112,952 | B2 * | 9/2006 | Arai et al. ................... 324/158.1 |
| 7,187,293 | B2 * | 3/2007 | White et al. ................ 340/572.8 |
| 7,279,920 | B2 * | 10/2007 | Kramer ......................... 324/765 |
| 7,301,458 | B2 * | 11/2007 | Carrender et al. ......... 340/572.1 |
| 7,375,636 | B1 * | 5/2008 | Martin ....................... 340/572.1 |
| 2002/0196029 | A1 | 12/2002 | Schmidt |
| 2004/0263189 | A1 | 12/2004 | Perry |
| 2005/0032515 | A1 | 2/2005 | Mastio |

OTHER PUBLICATIONS

PCT International Search Report (dated Jan. 16, 2009), International Application No. PCT/US2008/076063, International Filing Date-Nov. 9, 2008, (16 pages).
Park, Piljae, et al., "A Feasibility Study of On-Wafer Wireless Testing", VLSI Design, Automation and Test, Apr. 23, 2008, IEEE International Symposium on, IEEE, Piscataway, NJ, USA, XP031272495, ISBN: 978-1-4244-1616-5, (pp. 299-302).

(Continued)

*Primary Examiner* — Paresh Patel
(74) *Attorney, Agent, or Firm* — Blakely, Sokoloff, Taylor & Zafman LLP

(57) ABSTRACT

Over the air or radiated testing of an RF microelectronic or integrated circuit device under test (DUT) that has an integrated millimeter wave (mmw) antenna structure, is described. The antenna structure may have multiple elements in an array design that may be driven and/or sensed by integrated RF transmitter and/or receiver circuitry. An interface printed wiring board (e.g., a tester load board or a wafer probe card assembly) has formed in it a mmw radiation passage that is positioned to pass mmw radiation to and/or from the integrated antenna of the DUT. Test equipment may be conductively coupled to contact points of the interface board, to transmit and/or receive signals for testing of the DUT and/or provide dc power to the DUT. A test antenna is designed and positioned to receive and/or transmit mmw radiation through the passage, from and/or to the integrated DUT antenna. Other embodiments are also described and claimed.

25 Claims, 9 Drawing Sheets

OTHER PUBLICATIONS

Schaub, Keith, et al., "Evolutionary Changes for RF Device Testing", EE Evaluation Engineering, Oct. 2006 [Online], vol. 45, No. 10, XP002508668, Nelson Publishing USA, Retrieved from the Internet: URL: http://archive.evaluationengineering.com/archive/articles/1006/1006evolutionary.asp (retrieved Dec. 16, 2008), (pp. 12-18).

Gahagan, Dean A., "RF (Gigahertz) Ate Production Testing on Wafer: Options and Tradeoffs", ITC International Test Conference, IEEE 1999, Paper 15.2, (pp. 388-395).

* cited by examiner

RF INTEGRATED CIRCUIT TEST METHODOLOGY AND SYSTEM

This patent application claims benefit of the earlier filing date of provisional application Ser. No. 61/014,656, filed Dec. 18, 2007, entitled Millimeter-Wave Tests Methodology.

BACKGROUND

An embodiment of the invention relates to a methodology and system for testing a microelectronic or integrated circuit device that has an integrated millimeter wave antenna structure. Other embodiments are also described.

Recent advances in microelectronic or integrated circuit fabrication technology have paved the way for system-on-a-chip (SoC) devices that also have integrated radio frequency (RF) transmitter and/or receiver circuitry. Such integrated radio devices have become commonplace in consumer grade products that rely on wireless communications, such as cellular telephones and notebook or laptop computers. The challenge posed by testing the RF functionality of such integrated radio devices in the high volume manufacture (HVM) setting has been met in part by recent developments in RF automatic test equipment (ATE). These can provide high testing throughput by combining mixed analog, RF and digital testing with automated wafer and package handling capabilities.

Typical RF ATE incorporate RF instrumentation circuitry. These are used for making conductive or guided wave RF measurements taken from an integrated radio device (e.g., VSWR, S-parameters, and intermodulation, in addition to many others). The ATE supports one or more RF ports, which can source and measure continuous and modulated signals typically in the range 10 MHz-6 GHz.

For testing packaged devices, a load board, that may incorporate custom circuitry specific for testing a particular device under test (DUT), is conductively connected to the RF instrumentation circuitry (and to DC power, digital inputs/outputs, and ground connections in the ATE), by for example RF cables and connectors, e.g. blind mate SMA or SMP type connectors. Typically, a single RF port is dedicated for each input or output RF signal in the DUT. The load board may have a socket to receive the packaged DUT that has been picked up and delivered to it by an automatic handler. Once the DUT has been installed in the socket, its power and signal pins are conductively coupled to the DUT side of the instrumentation circuitry. A tester computer is connected to the tester side of the instrumentation circuitry. The tester runs software to conduct a test procedure in which the instrumentation circuitry is commanded to stimulate the DUT and capture the DUT's RF output response, which are then stored by the tester in digital form.

For testing a DUT at the wafer level, an automated probe card can be used. The probe card may have RF contact probes that can touch down onto matching conductive RF input or output pads on a top or bottom face of one or more DUTs (in the same wafer), to route RF signals (and DC power) between the DUT and the instrumentation circuitry. On its tester side, the probe card may be connected to the tester through RF cabling. Thus, the DUTs in the wafer can be subjected to conductive RF testing under control of the tester.

SUMMARY

An embodiment of the invention is a test methodology and system for over the air or radiated testing of an RF microelectronic or integrated circuit device (DUT) that has an integrated antenna structure. The antenna structure may have multiple elements in an array design that may be driven and/or sensed by, for example, integrated, beam steering, transmitter and/or receiver circuitry and that develops a millimeter wave (mmw) radiation pattern. The test system has an interface printed wiring board that has a first face that is to face the radiation pattern of the DUT's integrated antenna. A number of contact points are provided in the interface board, to contact matching ones of the DUT, or those of a connection or daughter board onto which the DUT has been installed. In one embodiment, the interface board has formed in it a mmw radiation passage from the first face to its opposite, second face, that is positioned to pass mmw radiation to and/or from the integrated antenna of the DUT. Test equipment may be conductively coupled to the contact points of the interface board, to transmit and/or receive signals for testing of the DUT and/or providing dc power to the DUT. A test antenna is designed and positioned to receive and/or transmit mmw radiation, in this example through the passage of the interface board, from and/or to the integrated DUT antenna. The test equipment may be further coupled to use the test antenna to obtain DUT testing data from, and/or deliver DUT testing data to, the DUT. Other embodiments are also disclosed.

The above summary does not include an exhaustive list of all aspects of the present invention. Indeed, the invention includes all systems and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
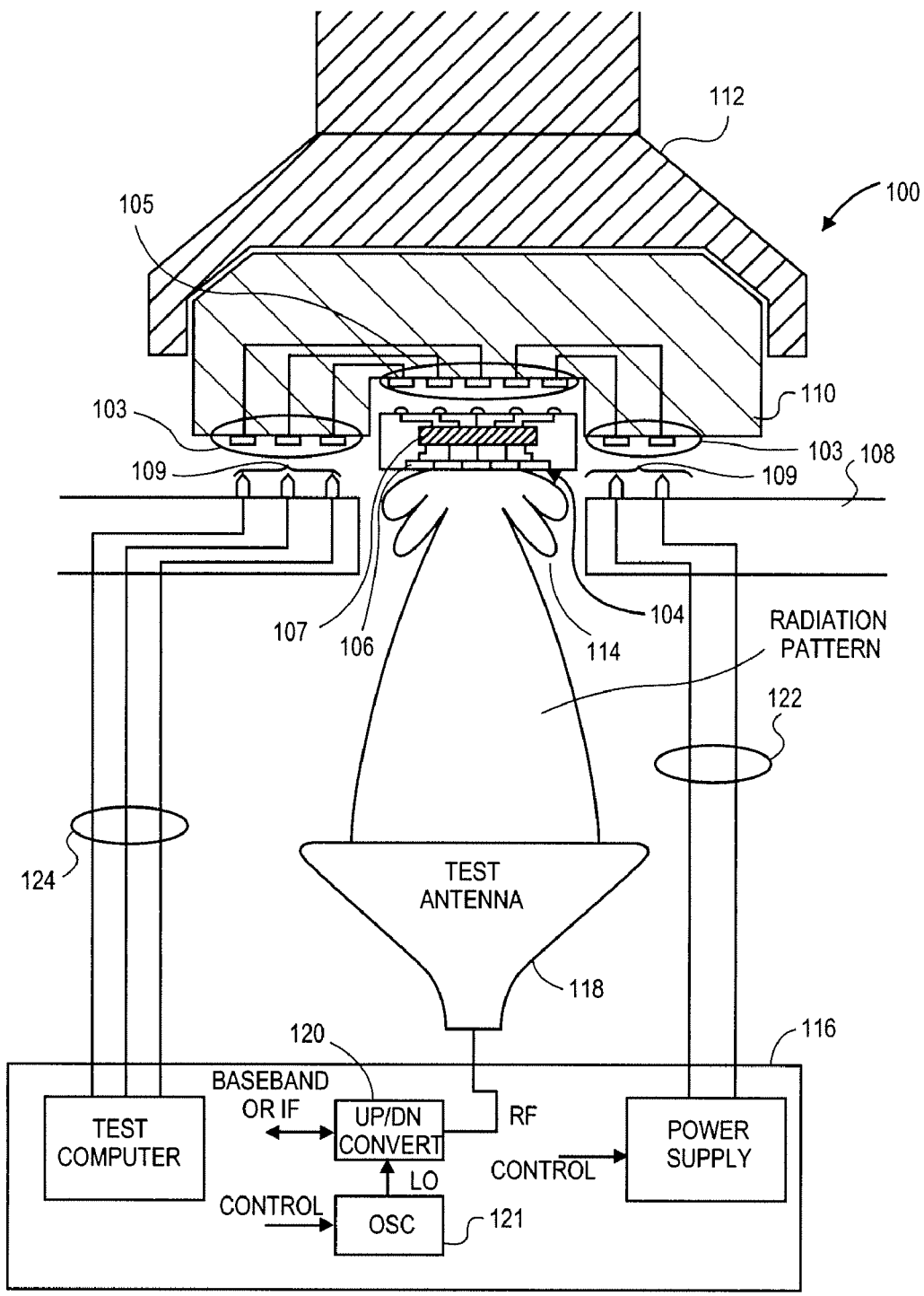
FIG. 1 is a diagram of an over the air RF test system.

In this section several embodiments of this invention are explained with reference to the appended drawings. Whenever the shapes, relative positions and other aspects of the parts described in the embodiments are not clearly defined, the scope of the invention is not limited only to the parts shown, which are meant merely for the purpose of illustration.

I. The Device Under Test

Before describing in detail the various test systems and methodologies, some examples of the microelectronic integrated circuit devices that may be tested (the devices under test or DUTs) are given. Note these are just a few examples of the different DUTs that may be tested; the test systems and methodologies described below could also be useful with other types of DUTs that may need to be tested to verify their RF functionalities.

In one embodiment, the DUT has an antenna structure that is integrated with its associated RF transmitter and/or RF receiver circuitry. In other words, the antenna is connected in and becomes a part of the final integrated circuit package, and thus would be part of the device's production testing. For example, the antenna structure may be on chip with its associated RF transmitter and/or receiver circuitry, in the same "radio integrated circuit die" (radio die). In particular, the antenna structure may be manufactured directly in one or more of the metal layers of the radio die, as part of the same overall integrated circuit fabrication process that yields, for example, the rest of a system on a chip, SoC (e.g., a complimentary metal oxide semiconductor, CMOS, fabrication process). As an alternative, the antenna structure may be located substantially off-chip, but in the same package, multi-chip module, or multi-package module as the radio die. For example, the antenna structure may be manufactured in one or more metal layers of an electronics substrate or chip carrier. The radio die would be attached to the chip carrier to communicate with the antenna structure through conductive traces or lines formed or routed in one or more metal layers of the chip carrier. In the module embodiment, one or more additional dies or packaged dies would also be attached to the carrier, to communicate with the radio die.

In one embodiment, the integrated antenna structure may operate or have a radiation pattern somewhere in the range 20 GHz to 300 GHz which are millimeter wave, mmw, frequencies that are above infrared and below optical frequencies. As an example, the antenna structure may operate in a frequency band around 24 GHz, 60 GHz, or 77 GHz. The antenna structure may have multiple elements in an array design that may be driven and/or sensed by the associated RF transmitter and/or receiver circuitry. This yields a mmw radiation pattern that may be changed or adapted through operation of the associated RF circuitry, to overcome the effects of interference and line of sight issues that arise with millimeter wave propagation. For example, the radio die may have beam steering capability, to adapt or change the mmw radiation pattern of the integrated antenna array (in response to changing interference and line of sight conditions). Multiple elements can additionally or alternatively be used to obtain additional robustness and/or higher data rates by transmitting different data or combinations of data from different subsets of the elements using methods including, but not limited to, spatial multiplexing and space-time coding. The array may have as few as two elements or as many as thirty elements, or more. In such a case, it would be difficult to conduct a conventional, conductive RF test of the associated RF transmitter and/or receiver circuitry, as many RF test ports or an RF switching matrix may be needed in the RF ATE (to test the RF chain for each and every antenna element).

Note that without limiting generality, the terms RF and millimeter wave are often used interchangeably when referring to the final radiation to or from the DUT's integrated antenna, which can be an RF signal in the millimeter wave band. Additionally the terms IF and RF are often used interchangeably when referring to the frequency of signals down-converted from or up-converted to the RF/millimeter wave frequencies since the signals are intermediate frequency with regard to a millimeter wave system but in the range of RF signals for conventional RF test equipment.

In the case where the DUT is a packaged device (e.g., a SoC) or a module, the DUT has a chip carrier or substrate that has a top face, a bottom face and one or more sides. Note the terms "top face" and "bottom face" are used here only for distinguishing one face of a die or carrier from the other; they are not otherwise limiting. The chip carrier may be a substrate made of ceramic or other suitable material, and may have multiple metal layers therein for routing power and signals to an attached radio die. These may include high frequency RF signals for the antenna structure, lower frequency analog signals, digital signals and dc power (that may be obtained from the pins of the DUT). In one example, the pins that are part of the digital signaling and power supply interfaces of a SoC may be formed on the bottom face and/or on the side(s) of the chip carrier. These may be soldered to mating pads in a printed wiring board of a consumer grade electronics appliance. As an alternative, the DUT/SoC may be one that is to be inserted into a mating socket on the printed wiring board. Note that the term "pin" as used here is not limited to an actual integrated circuit package pin but more generally refers to an electrical or conductive contact piece such as a surface mount lead, a die pad, a pod, a ball (as found in, e.g. a ball grid array or BGA), or other similar conductive end point or end region used in microelectronic dies and packaging to pass an electrical signal or electrical power to or from a device.

In one instance of a packaged SoC device, the constituent radio die is attached to the bottom face of the chip carrier, while the integrated antenna structure is formed in a metal layer of the carrier above the attached die (e.g., in the top metal layer and/or other metal layers of the carrier). The antenna structure is thus "aimed" upwards relative to the bottom face of the carrier. Note the carrier's top surface may actually be a dielectric or non-conductive layer, above the top metal layer. The antenna structure would be conductively coupled to signal with the associated, integrated RF transmitter and/or receiver circuitry of the radio die, through one or more conductive lines or routing traces in one or more metal layers of the carrier.

The radio die may have flip chip characteristics, in that it may have pads or balls on its face (top face, in this case) that have been directly bonded to matching contacts or pins in the face of the carrier, by solder connections. Alternatively, or in addition, there could be pads on the opposite face of the die (bottom face, in this case) that have been connected to pins in the chip carrier using a wire bonding process. Some of these pads may be part of the electrical RF connection between the radio die and the antenna structure. This interface may also include routed signal or power lines in one or more metal layers of the carrier. Other pads of the radio die serve to allow the die to signal with the pins of the carrier that are part of the digital signaling and power interfaces of the SoC.

Figure 2:
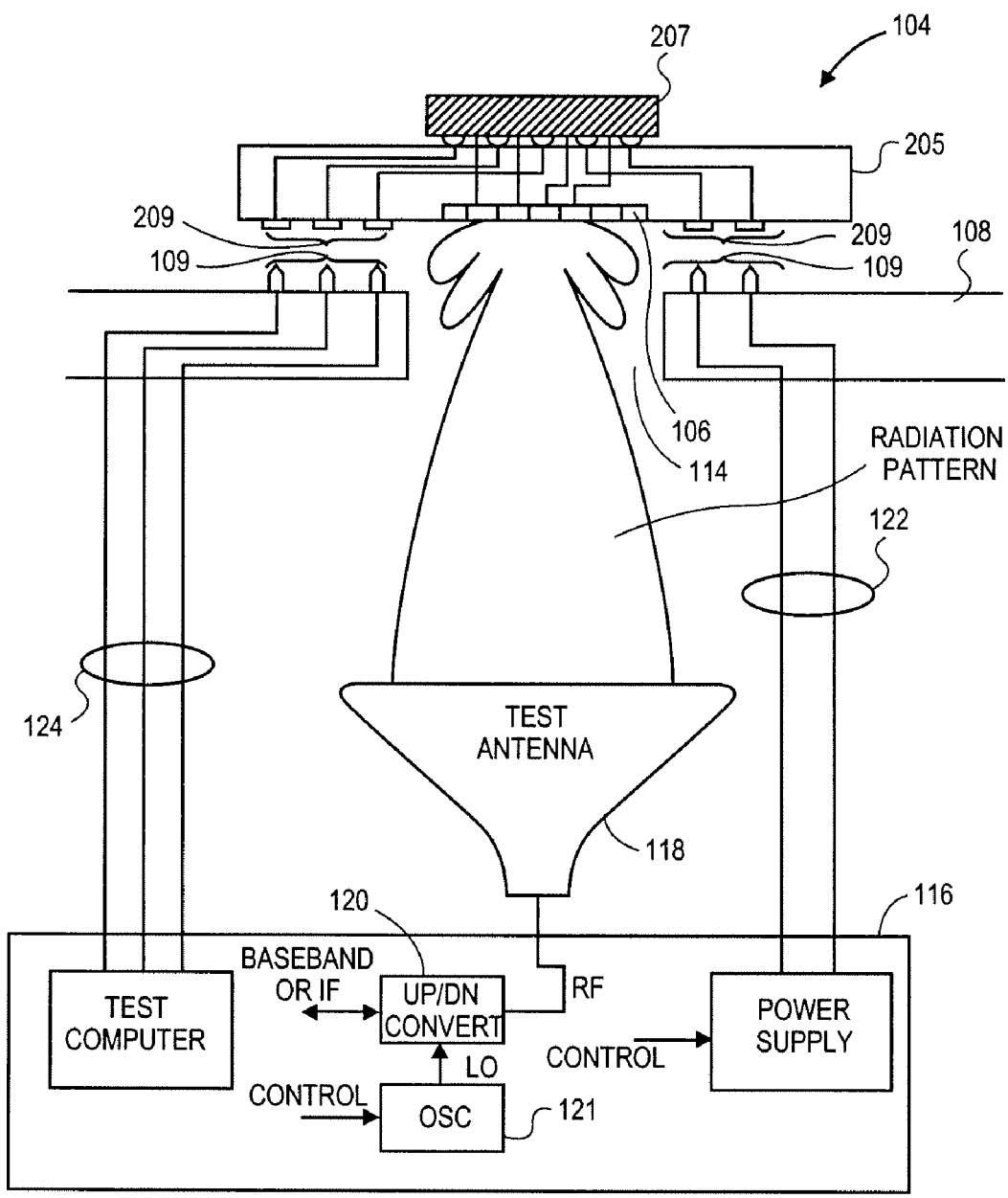
FIG. 2 shows a test system without a connection or daughter board.

In another instance of a packaged die, the antenna structure is on or near the top metal layer on one face of the chip carrier, while the radio die is attached to the opposite face of the carrier. As to the pins of such a device (that are to be used for testing the die), these may be located on the same as face of the chip carrier as the radio die. Compare the embodiment of FIG. 2 which shows a DUT 104 whose pins 209 (used for testing) are located on the opposite face of the carrier as the radio die 207 itself. In a further instance of a packaged die, the antenna elements are located or on or aimed away from the same face of the chip carrier as the one to which the radio die is attached. In all of these cases, the electrical connections needed between the antenna and the radio die and between the radio die and its pins may be obtained by suitable routing of signal and power traces through the multiple metal layers of the chip carrier and the radio die.

In another case, the DUT may be a radio die whose antenna structure is integrated or on-chip with (including being conductively coupled to signal with) its associated RF transmitter and/or receiver circuitry. In that case, the DUT may be subjected to radiated mmw testing in accordance with an embodiment of the invention described below, while it is still part of an undiced wafer.

The DUT may be a SoC that has integrated digital signal processing, DSP, and analog signal processing capability, for use as a consumer grade, mmw communications transceiver device.

Figure 9:
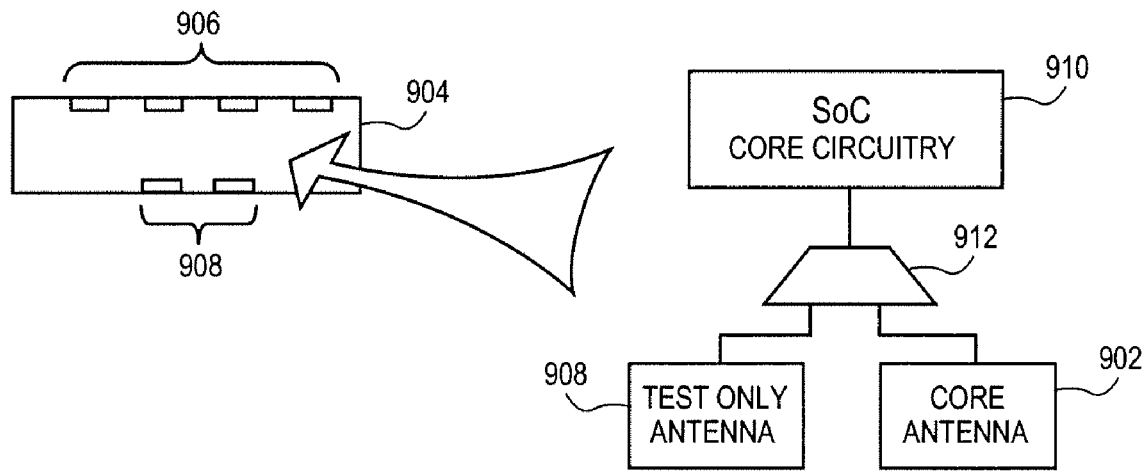
FIG. 9 shows a diagram of a radio device with an integrated test only antenna.

In yet another embodiment, the DUT is a radio die that has a "core" or normal operation antenna structure 906 formed in or near its top metal layer, and a separate, "test only" antenna structure 908 formed in or near its bottom metal layer. FIG. 9 shows a diagram of such a radio device 904, including internal circuitry that features the core circuitry 910 of a SoC that is coupled to the two antenna structures, namely the core antenna structure 906 and the test only antenna structure 908. In this example, the two antenna structures are formed on opposite faces of the radio die and aimed in opposite directions. As an alternative, one or both of the antenna structures 906, 908 could be formed on the sides of the die, rather than its faces. A selectable coupler or multiplexer 912 alternately connects the same port or ports of the core circuitry 910 to one or the other antenna structure 906, 908, e.g. depending on whether the radio device is in normal operation mode or test mode. In one embodiment, the multiplexer 912 includes a switched matrix of RF or mmw power amplifiers that are digitally controlled. Such an arrangement is able to "route" one or more RF signals between the same port or ports of the core circuitry 910, and either the core antenna 906 or the test only antenna 908 (depending on the mode of operation). In the antenna array embodiment, this technique allows the associated RF chain for each and every core antenna element of the array to be verified by a radiated RF or mmw testing methodology that uses the test only antenna structure 908, rather than the core antenna 906. As explained below, this design may avoid the need for a connection board in a HVM test setting.

Figure 10:
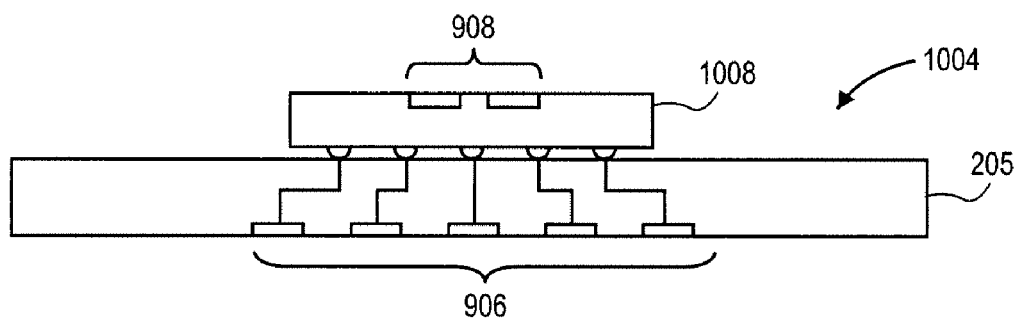
FIG. 10 shows another radio device with an integrated test only antenna.

FIG. 10 shows another embodiment of a radio device having an integrated test only antenna structure 908. In this case, an integrated circuit package 1004 includes the substrate or chip carrier 205 on one face of which a radio die 1008 is attached, and on or near another face of which are formed the core antenna structure 906. This may be similar to the embodiment of the DUT 104 illustrated in FIG. 2, except that the radio die 1008 has replaced the radio die 207 (package pins 209 though present are not shown in the embodiment of FIG. 10). The radio die 1008 has formed on its face, which is opposite the one having conductive points that connect with the antenna structure 906, the integrated on-chip test-only antenna structure 908. The radio die 1008 may have the same internal circuit arrangement as the radio device 904 described above.

II. The Test System and Methodology

Several test systems and methodologies are now described, in accordance with one or more embodiments of the invention. These may be used in a high volume manufacture (HVM) or production setting, or they may be used in a laboratory setting, as applicable. The HVM setting may involve the use of a wafer probe station for automatically moving from one die to another of a given wafer. For testing packages or modules, an automated handler may be used that picks up a package or module and places it on a RF test head. As explained below, in the laboratory setting, there may be no need for the connection board or daughter board, if the user can manually install the DUT to the interface board (see FIG. 2).

In FIG. 1, a diagram of an over the air mmw test system 100, for testing a DUT 104 that has an integrated mmw antenna structure, is shown. The DUT 104 may be a packaged radio die (an integrated circuit package) or an integrated circuit module that has therein an integrated mmw antenna structure 106. The DUT 104 may be a SoC, a system in a package, or a module, that has at least one integrated radio die 107. The radio die 107 has on-chip RF transmitter and/or receiver circuitry that are associated with and coupled to the antenna structure 106. An example of such a device is a consumer grade, beam stearing mmw communications transceiver device.

The test system 100 has an interface board 108 whose top face is oriented to face the radiation pattern of the antenna structure 106, when the DUT 104 has been placed in position to be tested by the system 100. The interface board 108 has a bottom face that is opposite the top face. The interface board 108 may be a printed wiring board or printed circuit board that acts as a physical interface between the DUT 104 and test equipment 116. As an example, the interface board 108 may be a custom RF load board that has been modified especially for the radiative, electrical and physical characteristics of the particular DUT 104. The interface board 108 has a number of contact points 109 (e.g., pogo pins or other suitable alternatives), exposed on its top face, that are to provide temporary conductive connections with matching contact points 103 (e.g., pads) of a connection board or daughter card 110 onto which the DUT 104 has been installed for testing purposes.

The connection board 110 is not part of the DUT 104 in this case, but rather may be deemed a part of the test system 100. A purpose of the connection board 110 is to turn the DUT 104 upside down as shown during testing, so that the radiation pattern of its antenna structure 106 is now aimed at (or faces) the top face of the interface board 108, away from an automated handler 112 that is holding the connection board 110 and/or the DUT 104. Some type of mechanical guide and/or locking mechanism may be needed to ensure proper alignment of the pins of the DUT 104 with mating contact points 105 of the connection board 110 with which temporary electrical connections are made during testing. For example, a test socket (not shown) may be soldered to the contact points 105 and that receives therein the DUT 104. The DUT 104 may be held against the connection board 110 by for example the force of vacuum or a spring. The handler 112 grips or otherwise holds this combination of the DUT 104 and the connection board 110 in the orientation shown, and brings them to the top face of the interface board 108, to make the electrical connections with the contact points 109. A further mechanical guide and/or locking mechanism (not shown) may be needed to ensure proper mechanical alignment and mating of the contact points 109 of the interface board 108 to the mating contact points 103 of the connection board 110.

Note that a further purpose of the connection board 110 in this case is to conductively route lower frequency analog signals, digital signals (including data, address and/or control signals), and/or power as defined by the pin assignments of the DUT 104, between the contact points 109 of the interface board 108 and matching pins of the DUT 104. This is done via signal and power lines that have been routed in one or more layers of the board 110, conductively coupling each of its contact points 103 to a respective contact point 105 as shown in FIG. 1.

The low frequency analog signals and digital signals of the conductive interface (pins) of the DUT 104 may be carried by lines or cables 124 that couple the contact points 109 to the test equipment 116, including a test computer that may be part of the test equipment 116. The lines or cables 122 provide dc power to the appropriate ones of the contact points 109, from a power supply that may also be controlled by the test computer.

In this embodiment, the interface board 108 has a mmw radiation passage 114 formed therein, from the top face to the bottom face as shown. The radiation passage 114 is positioned to pass unguided mmw radiation to and/or from the integrated antenna structure 106 of the installed DUT 104. This radiation is associated with conducted test signals that are conducted to or from the installed DUT 104 via the contact points 109 of the interface board 108. For example, the conducted test signals may deliver certain information to the DUT 104, which the DUT 104 then transmits by radiating the information using its integrated RF antenna. In another embodiment, the conducted test signals deliver certain information to the test equipment 116 that the DUT 104 originally received through radiation that impinged on its integrated RF antenna. The radiation passage 114 may be simply an empty, top to bottom hole or opening in the board 108, or it may have an engineered shape and/or be filled with a material that makes it more suitable for passing or guiding the mmw radiation.

The system 100 has test equipment 116 that is conductively coupled to some or all of the contact points 109 of the interface board 108. It uses the temporary electrical connections, made through the points 109, to provide dc power to and transmit and/or receive digital and low frequency analog or RF signals for testing of the installed DUT 104. The test equipment 116 may include RF instrumentation circuitry such as that typically found in a conventional RF test head, for example. A tester computer is connected to the tester side of the instrumentation circuitry. The tester computer runs software to conduct a test procedure in which the instrumentation circuitry in the RF ATE is commanded to stimulate the DUT 104 and capture the DUT's mmw response, which are then stored by the tester in digital form. This is done using a test antenna 118, as follows.

The test antenna 118 should be positioned at a predetermined distance and direction from the antenna structure 106 of the DUT (e.g., from a few inches to a few feet), to receive and/or transmit the required radiation for testing the operation of the antenna structure 106. The test antenna 118 may be a directional horn antenna or any other design that provides the needed gain pattern, for capturing a radiated signal from the DUT, and sourcing a radiated signal to the DUT, for testing of the DUT's associated RF transmitter and receiver circuitry. The test antenna can also be an array of more than one antenna, each collecting or emitting separate RF signals.

The mmw port of the test antenna 118 is conductively coupled to a mmw port of an up and/or down frequency converter 120, e.g. via a mmw cable or wave guide. A signal generator 121 provides the LO signal to the LO port of the up/down converter 120. The baseband or IF port of the converter 120 provides a downconverted version of the radiated signal received by the test antenna 118, and/or an upconverted version of a test signal to be radiated by the antenna 118. The baseband or IF signal that is output from the down converter is a test signal for testing the DUT 104, and may be further processed by baseband or RF instrumentation circuitry that is part of the test equipment 116, prior to being stored and analyzed by the test computer. Similarly, a stimulus test signal output from the test computer may be processed by baseband or RF circuitry in the test equipment 116, prior to being input to the up converter. Use of the converter 120 thus helps overcome frequency limitations of the test equipment 116, obviating the need to design and implement mmw instrumentation circuitry for the RF ATE. Note that the test computer may also be coupled to control frequency of the LO signal generator 121, and to control the dc power supplied to the DUT 104. The test computer 116 may conduct testing of the RF functionality of the associated RF transmitter and/or receiver circuitry of the DUT 104, by recording and controlling the radiated, mmw stimuli and/or responses acted upon by the mmw test antenna 118.

Thus, the test system 100, in one embodiment, advantageously uses only a single, RF source and/or measure port of the test equipment 116 (which is coupled to the baseband or IF port of the converter 120), and without any mmw conductive routing needed on the interface board or probe card (see FIG. 3 described below for the probe card embodiment).

Note that in contrast to testing in a HVM setting, testing the DUT 104 in a laboratory may not require the automated handler 112, as a user can manually place the DUT 104 itself or in combination the connection board 110 in position against the interface board 108.

Also, the test system 100 may in some cases do without the connection board 110. See FIG. 2, for example. In this case, the DUT 104 is shown as a packaged die or multi-chip module that has a radio die 207 attached to the bottom face of its substrate 205, where the "bottom face" of the substrate 205 in this orientation is actually facing up. The electrical connections between the radio die 207 and the conductive traces in the substrate 205 may be made, for example, via a flip chip process. The pins 209 of the DUT 104 are exposed on the top face of the substrate 205 (facing down), and surround the antenna structure 106 (oriented so that its radiation pattern as shown is also facing down, i.e. in the direction of the top surface of the interface board 108). The user may simply place the DUT 104 topside down against the interface board 108 as shown, so that the contact points 109 of the interface board 108 are aligned with and make temporary electrical connections with the permanent pins 209 of the DUT 104.

Figure 3:
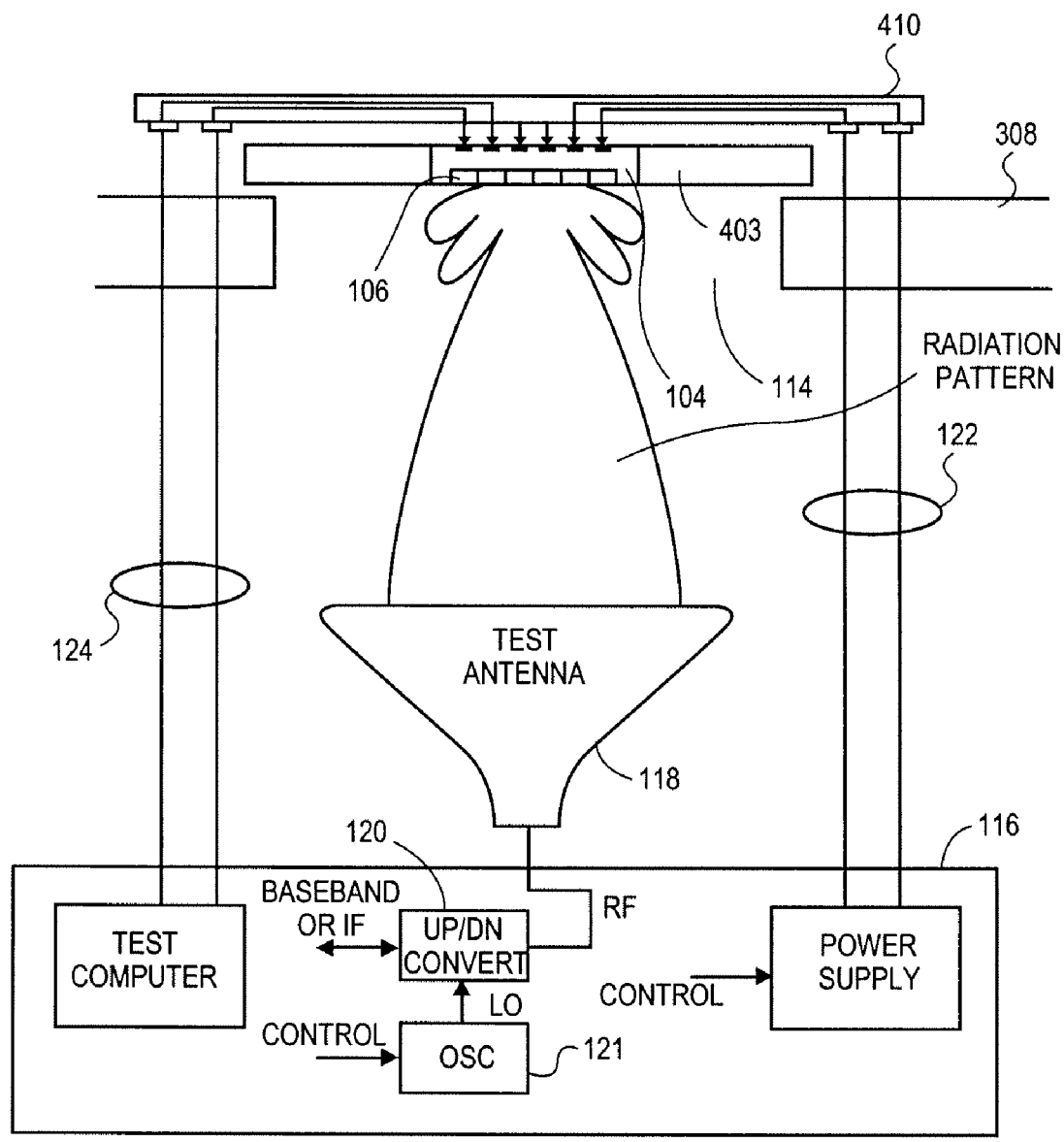
FIG. 3 shows a radio die in a wafer, undergoing a test.

FIG. 3 shows the test system 100 testing the DUT 104 being in this case a radio die (with an on-chip antenna structure 106) that is still part of a wafer 403. The wafer 403 is held by a wafer holding mechanism 308. A printed wiring board 410 has probes that touch "down" onto the signal and power pads of the radio die (DUT 104), to thereby electrically connect them to the test equipment 116 through lines 124, 122 which may be test cables. In this case, the interface board 108 and board 410 may be part of a wafer probe assembly or wafer probe test station that can automatically move the board 410 relative to the wafer 403, for sequentially testing one radio die and then another. This is may be done by keeping the wafer 403 fixed while moving the board 410 to another die, or by keeping the board 410 fixed while moving the wafer 403. Similarly, either one of the wafer 403 or the board 410 may be fixed while the other is moved vertically, so that the probes can touch down onto and then lift off the pads of the radio die.

Figure 4:
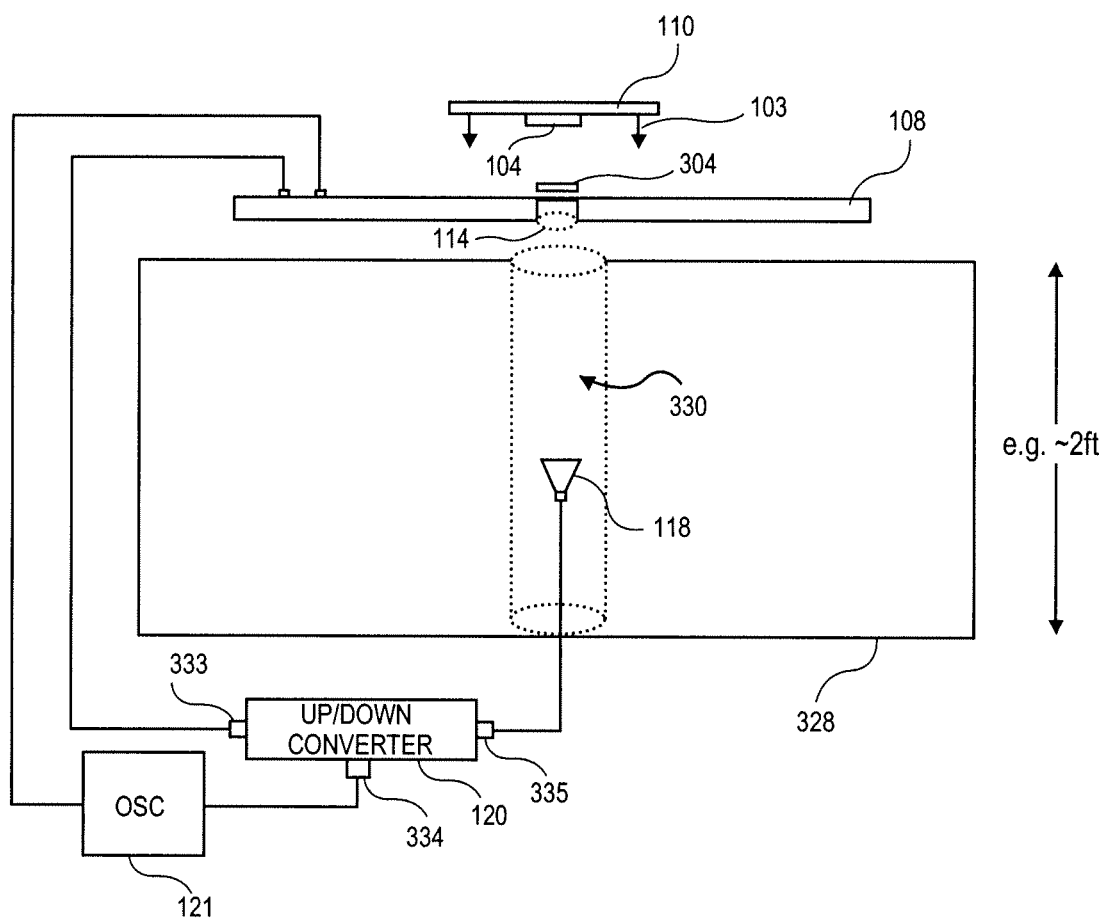
FIG. 4 shows a test system having a radiation chamber.

Turning now to FIG. 4, the test system 100 is shown in accordance with another embodiment of the invention. This system is also capable of alleviating the connectivity issues that arise when testing millimeter wave SoC integrated circuit devices, e.g. lack of a sufficient number of RF test ports, frequency limitations, and load board or probe card routing conducted mmw signals. The system 100 in this case also addresses the questions of where and how the "test assembly", which refers to the test antenna 118 and its associated RF cabling or waveguides and converter 120, should be located for HVM testing, and how to ensure accuracy and repeatability of the mmw measurements that are taken.

In a HVM setting, an automated device handler or wafer probe station can be used to move the DUT in and out of the ATE or move to a different die in a wafer. Because of the mechanics of the handler and wafer probe equipment, the test assembly may not be easily placed within the handler or probe station. Thus, the DUT may need to be placed topside down in a load board or wafer probe station, pointing the integrated antenna away from the handler or probe station—see FIGS. 1-3. In FIG. 4, the interface board 108 is directly above an RF test head 328 in which instrumentation circuitry is housed. One end of the instrumentation circuitry is connected to contact points of the interface board 108, and the other end is connected to the test computer (not shown). The RF test head 328 is also used in this embodiment, to house a chamber 330 in which the test antenna 118 is located and through which the over the air RF or mmw radiation for testing the DUT passes. Use of the chamber 330 as electromagnetic insulation helps reduce and may even eliminate electromagnetic interference from the ATE test facility environment, and to reduce and perhaps eliminate self-induced interference from reflections of surrounding surfaces. The chamber 330 may be designed so that the location of the antenna 118 therein relative to the DUT 104 can be adjusted. The chamber 330 may have conducting material on its outside to suppress external radiation, and could be lined internally with an absorbent material to attenuate reflections for the DUT's integrated antenna 106. In one embodiment, the chamber 330 is an anechoic chamber whose internal wall surfaces have been engineered to suppress reflections of the RF or mmw wave testing radiation of interest. The chamber 330 may be designed to mate to the bottom face of the interface board 108 or probe card, to create a totally enclosed system. The chamber 330 could be designed with a reflective surface on its inside, to focus the emissions of the DUT's integrated antenna 106.

The test antenna 118 placed in the chamber 330 may be cabled out to the up/down converter 120 as shown, and specifically to the latter's mmw port 335, by a mmw specified cable or test waveguide assembly. The up or down converted mmw signals are cabled to the interface board 108 as shown, from the baseband or IF port 333 of the converter 120, where they are connected to ATE RF connections (to instrumentation circuitry inside the test head 328 and then further downstream to the tester computer—not shown).

Still referring to FIG. 4, in this embodiment of the test system 100, a test socket (not shown) is placed on the bottom side of the daughter board 110 to receive therein the DUT 104. Conductive lines routed in the metal layers of the daughter board 110 connect the pins of the socket to the contact points 103 (which in this case are pogo pins on the bottom face of the daughter board). The pogo pins make temporary electrical connections to respective contact points on the top face of the interface board 108, thus routing the DUT's signals to the ATE, e.g. via cable to the instrumentation circuitry inside the test head 328. The mmw radiation passage 114 is created in the interface board 108, aligned with the socket in which the DUT 104 is installed. Note the test socket may have a lid 304 that may be fixed to the interface board 108, inside the passage 114, from the top or bottom face of the interface board. The lid 304 may alternatively be pivotally connected to the test socket and can be closed against the socket to ensure good electrical contact between the inserted DUT 104 and the socket pins. The lid 304 may also have a passage therein to allow mmw radiation to and/or from the DUT's integrated antenna to pass therethrough.

Figure 5:
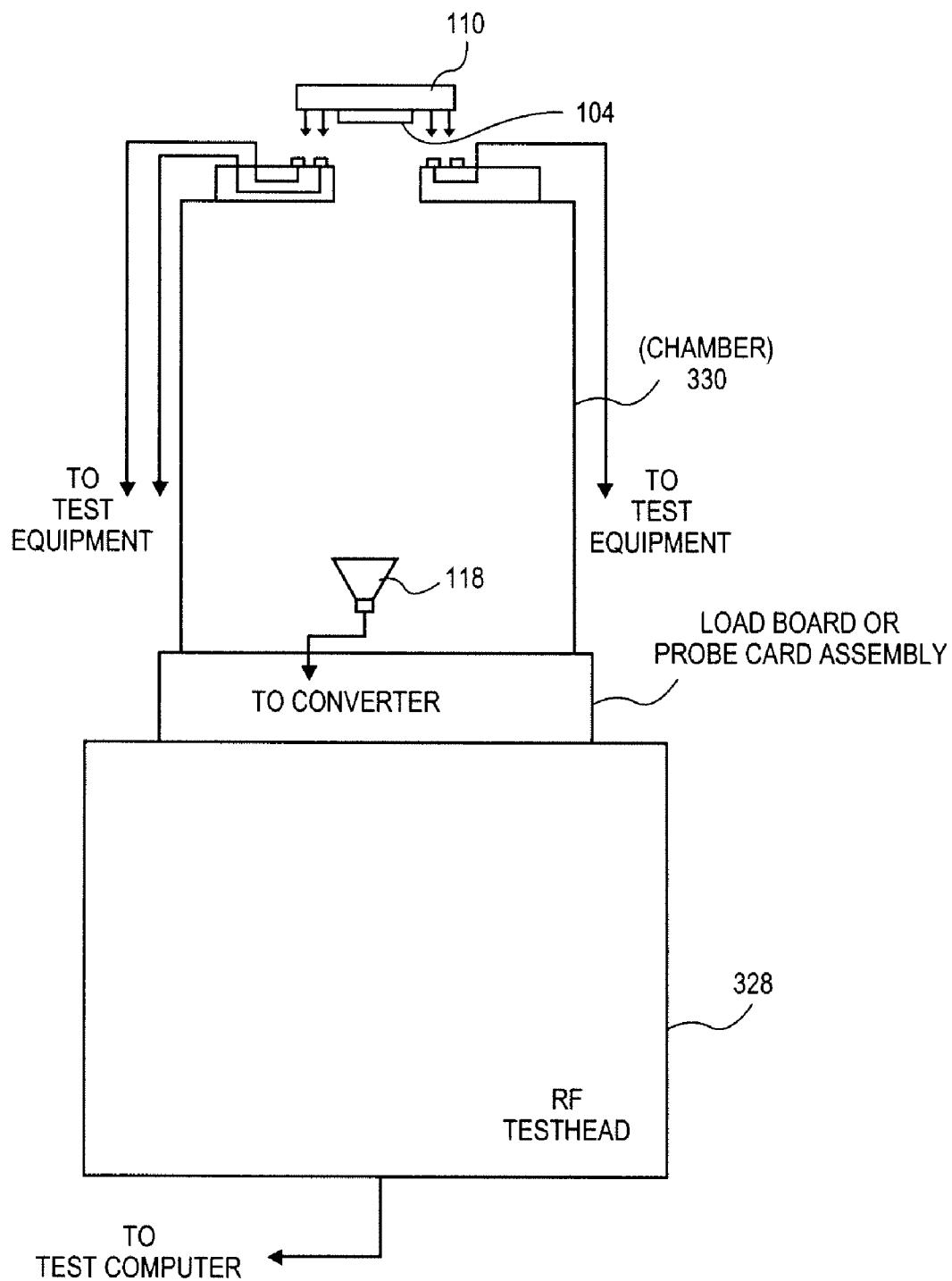
FIG. 5 shows a test system in which the chamber is located outside an RF test head.

The topside down approach of the test system 100 may also allow the chamber 330, where applicable, to be placed above the test head 328, rather than substantially inside it as shown in FIG. 4. This version is depicted in FIG. 5. In this case, the interface board 108 in which the passage 114 and the contact points for making connections with the pogo pins of the daughter board 110 are formed, is positioned above the chamber 330. The chamber 330 in that case could be placed on top of a conventional RF load board or wafer probe card assembly that lies above the test head 328 as shown. A mmw test cable or waveguide assembly connects the test antenna 118 from inside the chamber 330 to the converter 120. The latter may be located on the load board or probe card assembly, or it may be housed in the test head 328. The DUT 104 in this case would be lowered on to the contact points of the interface board 108 as shown to make the requisite electrical contact for conductively interfacing the relevant pins of the DUT 104 to the test equipment.

Figure 6:
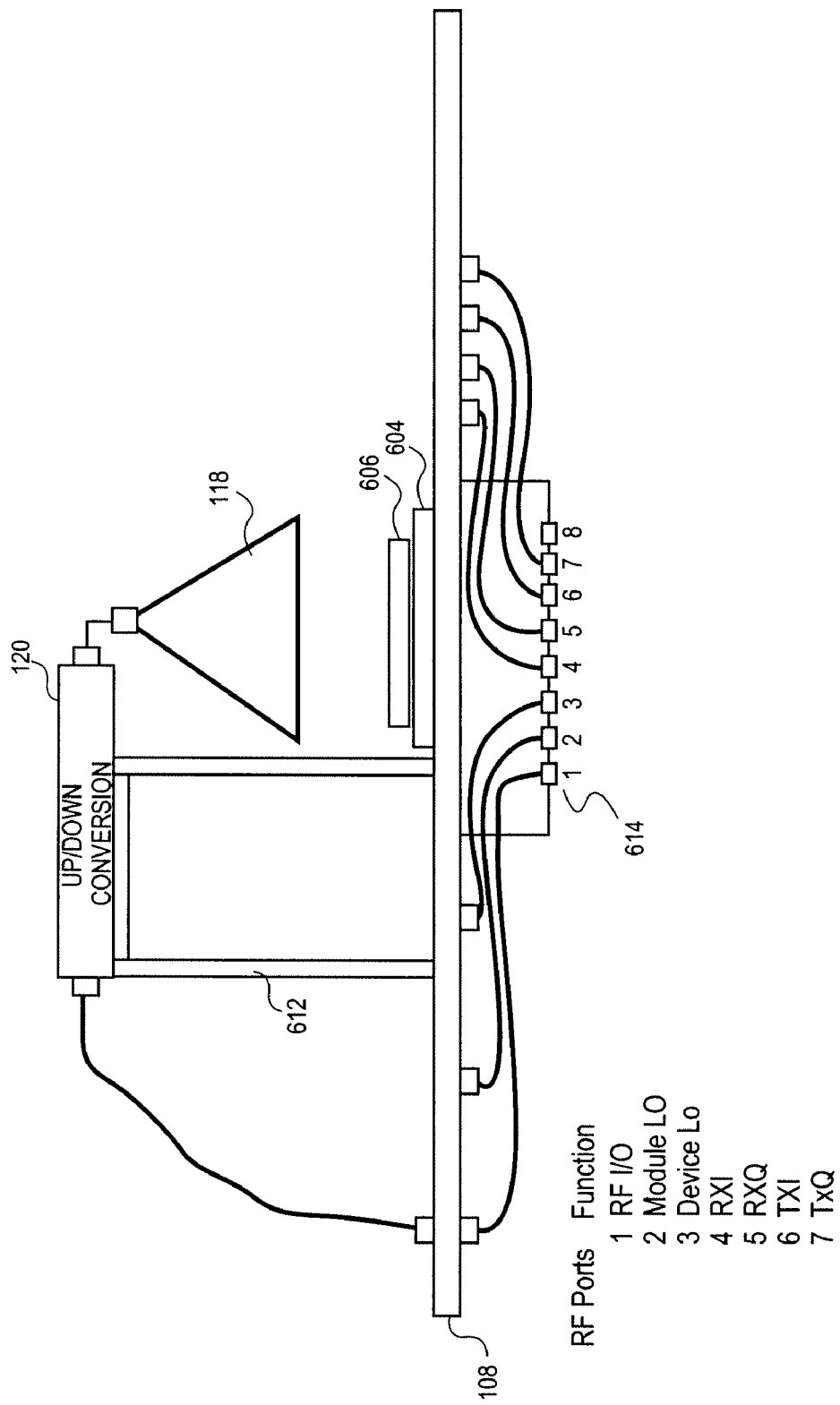
FIG. 6 is a diagram of another embodiment of the test system.
Figure 7:
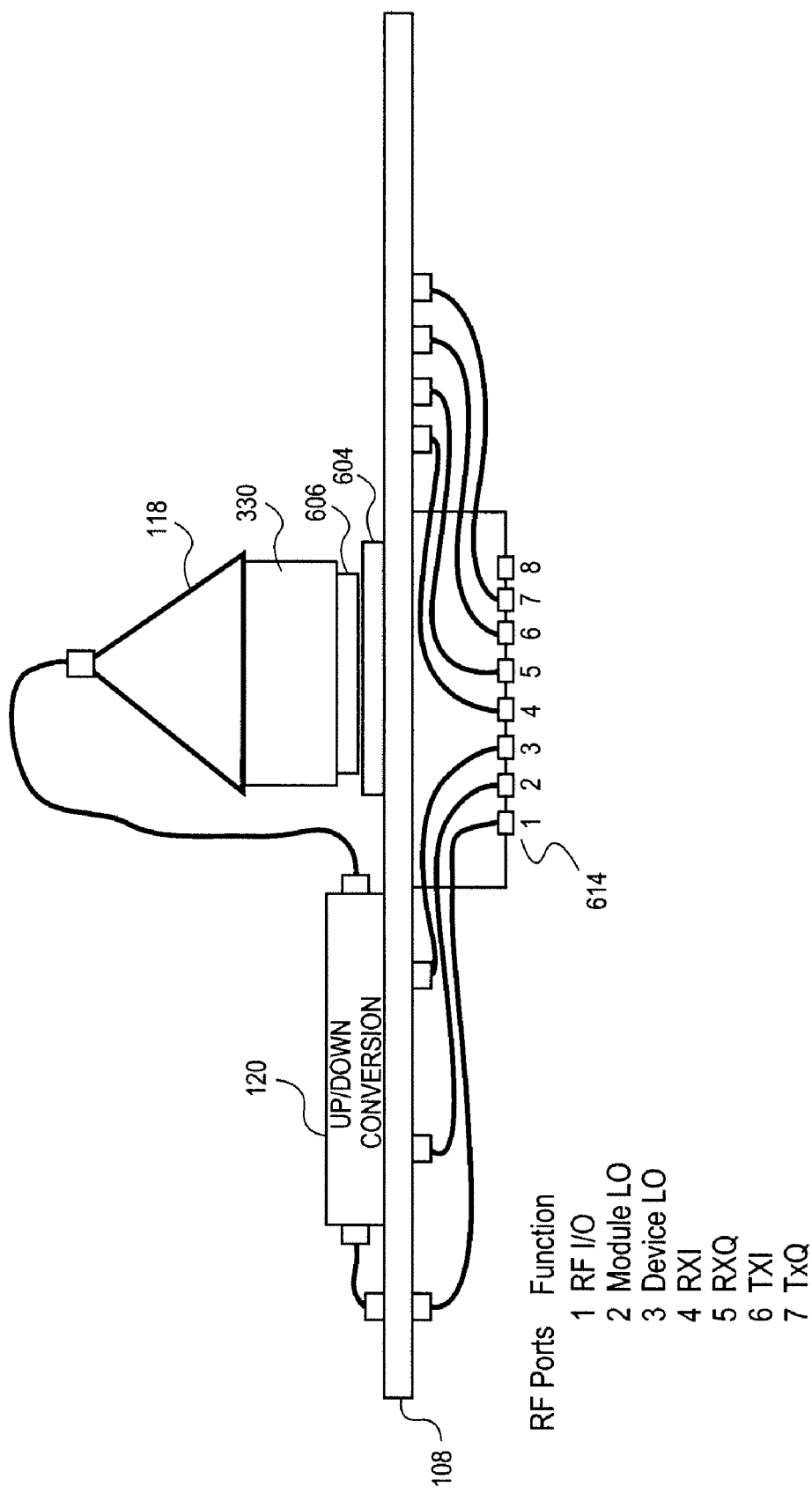
FIG. 7 is a diagram of yet another embodiment of the test system.

Turning now to FIG. 6 and FIG. 7 these are diagrams of embodiments of the test system where no RF or mmw radiation passage is needed through the interface board 108, for testing the DUT. In this case, the interface board 108 has a test socket 604 to receive the DUT 104 (not shown). A clamp 606 is then closed to secure the DUT and ensure good electrical contact between its pins and mating ones of the socket 604. The DUT 104 in this instance may have its pins located on its bottom face and/or its sides, while its top face has the integrated antenna, which is aimed upward at the test antenna 118. The test antenna 118 is coupled to the RF or mmw (upconverted) port of the up/down converter 120. The IF or baseband (downconverted) port of the converter 120 may be cabled to a port in the interface board 108. The test antenna 118 is raised above the clamp 606 as shown, to obtain the distance between the test antenna 118 and the DUT antenna needed for the mmw radiation pattern of the DUT antenna. This is achieved in the embodiment of FIG. 6 using a bracket or platform 612 that may rest against the interface board 108 as shown. In the embodiment of FIG. 7, the chamber 330 is placed between the test antenna and the socket 604 to raise the test antenna, instead of using the platform 612.

In one embodiment, the interface board 108 may be a conventional load board that has at least the following seven RF ports to connect with the test equipment (see FIG. 6 and FIG. 7):

port 1 (RF I/O) connects a signal between the test equipment and the IF/baseband port of the converter 120, where this signal contains a) content from a tester computer (not shown) that is to be upconverted and then radiated to the DUT antenna by the test antenna 118, and/or b) content to the test computer that was radiated by the DUT antenna, received by the test antenna 118 and then downconverted;

port 2 (Module LO) connects a LO signal (e.g., a mmw LO signal), from instrumentation circuitry in test equipment, to the LO input port of the converter 120;

port 3 (Device LO) connects a LO signal (from instrumentation circuitry in test equipment) to be input to the DUT;

ports 4 and 5 are signals (in-phase and quadrature components) output by the DUT that contain the content of the radiation that impinged on the DUT's integrated antenna; and ports 6 and 7 are signals (in-phase and quadrature components) input to the DUT that contain the content to be radiated by the DUT's integrated antenna.

Figure 8:
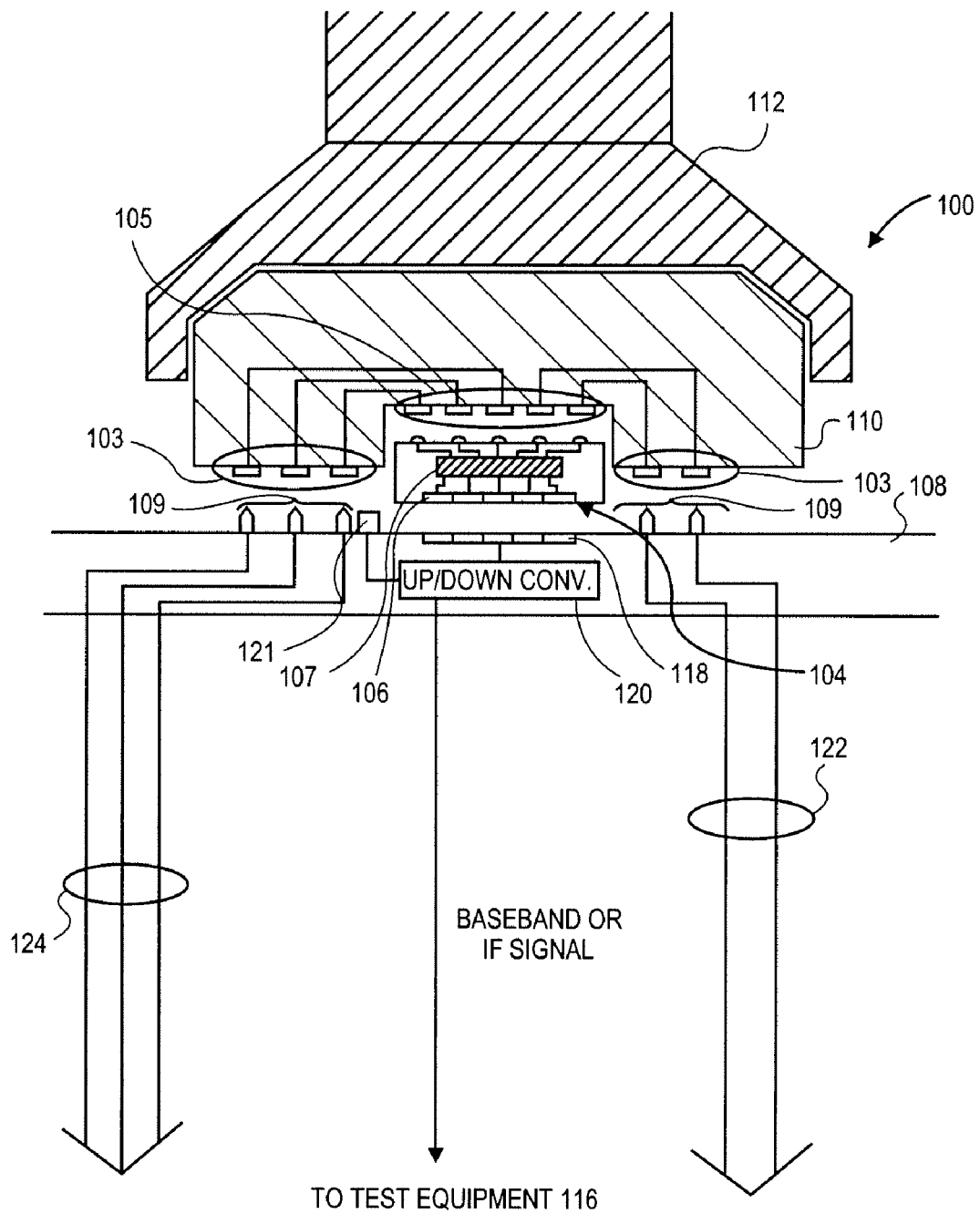
FIG. 8 is a diagram of still another embodiment of the test system.

Turning now to FIG. 8, this is a diagram of still another embodiment of the test system that needs no mmw radiation passage through the interface board 108. In this embodiment, the test antenna 118 has been embedded in or placed on the top surface of the interface board 118, facing the DUT's integrated antenna 106. The RF or mmw circuitry that makes up the signal generator 121 and the up/down converter 120, and their associated RF or mmw signal lines, may be formed in one or more metal layers of the interface board 118. Also, the connection board 110 may need to be modified, e.g. to obtain a deeper cutout in which to receive the DUT 104 as shown, so as to obtain the needed distance between the DUT antenna 106 and the test antenna 118. The interface board 118 in this case An embodiment of the invention is a method for testing the DUT 104 being in this case a radio die (with an on-chip antenna structure 106) that is still part of a wafer 403. The method comprises: a) holding the wafer 403 by a wafer holding mechanism 308; b) touching or contacting the probes of a printed wiring board 410 with signal and power pads of the radio die (DUT 104), to thereby electrically connect them to test equipment 116 through lines 124, 122 which may be test cables; c) applying power to contacted power pads of the DUT 104, and then applying a test signal to a signal pad of the DUT 104 thereby stimulating the DUT 104 to radiate a response via its integrated RF antenna structure 106; d) capturing and storing by the test equipment 116 the radiated response of the DUT 104, using an RF test antenna to which the test equipment 116 is coupled through an RF downconverter; e) breaking the contacting or touching of the probes with the power and signal pads of the DUT 104; f) and then moving the board 410 relative to the wafer 403 for sequentially testing another radio die (another DUT) in the same wafer 403; and then repeating b)-f) for said another radio die. The stored responses of the different radio dies in the wafer 403 may be evaluated by a test computer to compute performance metrics for the integrated RF circuitry in each of the tested DUTs.

An embodiment of the invention is a radio die that comprises: core circuitry (e.g., that of a SoC); an on-chip core or normal operation antenna structure; a separate, on-chip test only antenna structure; and a selectable coupler or multiplexer that alternately connects the same input or output port or ports of the core circuitry to one or the other antenna structure depending on whether the radio die is in normal operation mode or test mode, so that the same information that is input to (output from) a port of the core circuitry can be received (transmitted) as radiation by either the core antenna structure or the test only antenna structure.

Another embodiment of the invention is a radio device being an integrated circuit package comprising: a substrate or chip carrier; a radio die attached to the chip carrier, the radio die having core circuitry (e.g., that of a SoC); an in-package test only antenna structure (may be on-chip with the radio die, or off-chip, integrated in the chip carrier); an in-package core antenna structure (may be on-chip with the radio die, or off-chip, integrated in the chip carrier); and an in-package, selectable coupler or multiplexer (may be on-chip with the radio die, or off-chip in a separate die) that alternately connects the same input or output port or ports of the core circuitry to one or the other antenna structure depending on whether the radio die is in normal operation mode or test mode, so that the same information that is input to (output from) a port of the core circuitry can be received (transmitted) as radiation by either the core antenna structure or the test only antenna structure.

The invention is not limited to the specific embodiments described above. For example, although FIG. 1 shows the contact points 109 as pogo pins that are attached to the interface board 108, an alternative is to attach the pogo pins to the connection board 110 (in the locations referenced by contact points 103). Accordingly, other embodiments are within the scope of the claims.

What is claimed is:

1. A system for testing a microelectronic die or package/module device under test (DUT) that has a millimeter wave antenna, comprising:
an interface printed wiring board having a first face and a second face on a side opposite the first face, an area in the interface board through which transmission and reception of millimeter wave radiation occurs between the first face to the second face, and a plurality of contact points on the first face outside the area that are to contact matching ones of a connection board onto which the DUT has been installed, to transmit and/or receive signals for testing the DUT; and
a test antenna facing the second face of the interface board and being adapted to receive and/or transmit millimeter wave radiation through the area, from and/or to the antenna of the DUT.

2. The system of claim 1 further comprising test equipment that is conductively coupled to the contact points of the board to transmit and/or receive the signals for testing the DUT.

3. The system of claim 2 further comprising an up and/or down frequency converter having a mmw port that is coupled to the test antenna, an LO port that is coupled to a signal generator, and an IF or baseband port, wherein the test equipment is coupled to control the signal generator and transmit and/or receive test information on the IF or baseband port for testing the DUT.

4. The system of claim 3 wherein the converter is to (1) upconvert an output signal of the test equipment that is below 10 GHz to millimeter wave frequency, which is then radiated by the test antenna towards the DUT antenna, and (2) downconvert a millimeter wave signal received by the test antenna that was radiated by the DUT antenna, to a frequency below 10 GHz and provide it as an input signal to the test equipment.

5. The system of claim 4 wherein the IF or basedband port of the converter is conductively coupled to the test equipment via a conductive path through the interface board.

6. The system of claim 1 further comprising:
a connection board having a top face and a bottom face, the bottom face having a plurality of contact points for temporarily making electrical connections with pins of the DUT, and a plurality of pins to contact matching ones of the contacts points of the interface board.

7. The system of claim 6 wherein the interface board is a tester load board.

8. The system of claim 1 wherein the interface board is a wafer probe card assembly.

9. The system of claim 6 further comprising an automatically controlled handler having a chuck that is to hold the connection board, the handler to pick up or install the DUT to the connection board, from a DUT waiting or storage area in a volume manufacturing setting, and then move the DUT and connection board together to engage the interface board.

10. The system of claim 1 wherein the test antenna comprises a directional horn antenna.

11. The system of claim 1 further comprising a chamber, the test antenna being located within the chamber.

12. The system of claim 11 where the chamber is an anechoic chamber.

13. The system of claim 11 further comprising an RF test head or docking head wherein the chamber is located substantially between the interface board and the RF test head.

14. The system of claim 11 further comprising an RF test head or docking head, wherein the chamber is located substantially inside the RF test head.

15. The system of claim 11 wherein the interface board is a tester load board.

16. The system of claim 11 wherein the interface board is a wafer probe card assembly.

17. A method for testing a microelectronic die or package/module device under test (DUT) that has an RF antenna, comprising:
 installing the DUT to a first printed wiring board so that a temporary electrical connection is made between a plurality of pins of the DUT and a first plurality of contact points of the first board, respectively;
 bringing the first board, with the installed DUT, towards a second printed wiring board until a temporary electrical connection is made between a second plurality of contact points of the first board and a plurality of contact points on the second board, respectively; and, while the temporary connections are there, performing a test of the DUT by
 a) sending conducted test signals to the installed DUT via the plurality of contact points of the second board and receiving associated radiated test signals radiated by the RF antenna of the installed DUT, and/or
 b) radiating RF test signals to the RF antenna of the installed DUT and receiving associated conducted test signals from the installed DUT via the plurality of contact points of the second board.

18. The method of claim 17 wherein the installing and bringing are performed by an automated handler.

19. The method of claim 17 wherein the installing and bringing are performed by a wafer probe station.

20. The method of claim 17 wherein the installing the DUT comprises inserting the DUT into a test socket on the first board.

21. The method of claim 17 further comprising:
 after completing a test of the DUT, moving the first board, with the installed DUT, away from the second board to break the temporary electrical connection with the exposed contact points of the second board; and
 removing the DUT from the first board to break the temporary electrical connection with the first contact points of the connection board.

22. The method of claim 21 wherein the moving and removing are performed by an automated handler.

23. The method of claim 21 wherein the moving and removing are performed by a wafer probe station.

24. The method of claim 17 wherein the sending comprises sending dc power and digital test signals to the installed DUT via the plurality of contact points of the second board.

25. A method for testing a microelectronic die or package/module device under test (DUT) that has an RF antenna, comprising:
 installing the DUT to a first printed wiring board so that a temporary electrical connection is made between a plurality of contact points of the first board and a plurality of pins of the DUT, respectively; and, while the temporary connections are there, performing a test of the DUT by
 a) sending conducted test signals to the installed DUT via the plurality of contact points of the first board and receiving associated radiated test signals through an RF radiation passage in the first board, wherein the test signals are radiated by the RF antenna of the installed DUT, and/or
 b) radiating RF test signals through the RF radiation passage in the first board, to the RF antenna of the installed DUT and receiving associated conducted test signals from the installed DUT via the plurality of contact points of the first board.

* * * * *